(12) United States Patent
Iwasaki et al.

(10) Patent No.: US 7,141,840 B2
(45) Date of Patent: Nov. 28, 2006

(54) SEMICONDUCTOR DEVICE AND PRODUCTION METHOD THEREFOR

(75) Inventors: Tomio Iwasaki, Tsuchiura (JP); Norio Ishitsuka, Tsuchiura (JP); Hideo Miura, Tsuchiura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/503,350

(22) PCT Filed: Feb. 5, 2003

(86) PCT No.: PCT/JP03/01183

§ 371 (c)(1),
(2), (4) Date: Jul. 30, 2004

(87) PCT Pub. No.: WO03/075352

PCT Pub. Date: Sep. 12, 2003

(65) Prior Publication Data

US 2005/0079667 A1    Apr. 14, 2005

(30) Foreign Application Priority Data

Mar. 1, 2002  (JP) ............................. 2002-055174
Sep. 30, 2002  (JP) ............................. 2002-284713

(51) Int. Cl.
*H01L 31/112* (2006.01)
(52) U.S. Cl. ..................... 257/285; 438/549
(58) Field of Classification Search ............... 438/521, 438/529, 546–549; 257/61, 285, 335–336, 257/345, 450
See application file for complete search history.

(56) References Cited

U.S. PATENT DOCUMENTS

| 5,932,906 | A | 8/1999 | Shimizu | |
|---|---|---|---|---|
| 6,300,206 | B1 * | 10/2001 | Fukada et al. | 438/303 |
| 6,670,251 | B1 * | 12/2003 | Fukada et al. | 438/303 |

FOREIGN PATENT DOCUMENTS

| JP | 54-057861 A | 5/1979 |
|---|---|---|
| JP | 62-045165 A | 2/1987 |
| JP | 62-060263 A | 3/1987 |
| JP | 03-139827 A | 6/1991 |
| JP | 09-074176 A | 3/1997 |
| JP | 11-186188 A | 7/1999 |

* cited by examiner

*Primary Examiner*—Calvin Lee
(74) *Attorney, Agent, or Firm*—Townsend and Townsend and Crew LLP

(57) ABSTRACT

A semiconductor device having a high degree of reliability is provided. A second object of the invention is to provide a semiconductor device of high yield. The semiconductor includes a silicon substrate, a gate dielectric film formed on one main surface of the silicon substrate, a gate electrode formed by being stacked on the gate dielectric film and a diffusion layer containing arsenic and phosphorus. Both of the concentration of the highest concentration portion of arsenic and the concentration of the highest concentration portion of phosphorus are each at $10^{26}$ atoms/m$^3$ or more and $10^{27}$ atoms/m$^3$ or less, and the depth of the highest concentration portion of phosphorus from the surface of the silicon substrate is less than the depth of the highest concentration portion of arsenic.

2 Claims, 9 Drawing Sheets

US 7,141,840 B2

SEMICONDUCTOR DEVICE AND PRODUCTION METHOD THEREFOR

This application is a 371 of PCT/JP03/01183 Feb. 5, 2003.

TECHNICAL FIELD

The present invention relates to a semiconductor device having a high degree of reliability.

BACKGROUND ART

In the steps of manufacturing a semiconductor device, it is necessary to implant impurities into a silicon substrate and conduct a heat treatment for lowering electric resistance of the silicon substrate. In this case, crystal defects such as dislocations may sometimes occur in the silicon substrate. As a countermeasure for solving such a problem, a method of implanting arsenic of a large atomic radius and phosphorus of small atomic radius together thereby decreasing strains more than in the case of implanting only arsenic or phosphorus as described, for example, in Japanese Patent Laid-open Nos. 3-139827 and 3-184346.

However, as the structure has been complicated and microminiaturized and the diffusion layer has become shallower, when dislocations or the like occur accompanying introduction of impurities, their effect on electric characteristics is increased.

In view of the above, it is an object of the present invention to solve the foregoing subject and provide a semiconductor device having a high degree of reliability and a manufacturing method of the semiconductor device.

DISCLOSURE OF THE INVENTION

The present inventors have made earnest studies in order to obtain means capable of suppressing the effects caused by the occurrence of defects on electric characteristics and, as a result, have found that use of a semiconductor device or a manufacturing method thereof having the following constitution is preferred for solving the subject of the invention. Thus, a semiconductor device having a high degree of reliability and a manufacturing method of the semiconductor device at high yield are provided.

(1) A semiconductor device includes a semiconductor substrate, a gate dielectric film formed on one main surface of the silicon substrate, a gate electrode formed by being stacked to the gate dielectric film, and diffusion layer containing phosphorus as a first element and arsenic as a second element in which the depth from the surface of the silicon substrate where the concentration of the first element is highest is less than the depth from the surface of the silicon substrate where the concentration of the second element is highest. The second element could conceivably be antimony. An element heavier than the first element is selected as the second element. Further, it is preferred to select an element having a diffusion coefficient larger than that of the first element as the second element. Further, one of the first element and the second element has a larger and the other has a smaller atomic radius than that of the main constituent element of the semiconductor substrate (for example, silicon in a silicon substrate).

A specific constitutional example includes a semiconductor substrate, a region having impurities of an element belonging to the group III formed on one main surface of the semiconductor substrate, a gate dielectric film formed in the region, a gate electrode formed by being stacked on the gate dielectric film, and a source or a drain containing impurities of an element belonging to the group V element corresponding to the gate electrode, in which the source or the drain has a first element belonging to the group V and a second element belonging to the group V, one of the first element and the second element has a larger atomic radius and the other has a smaller atomic radius than that of the main constituent element of the semiconductor substrate, the depth from the surface of the silicon substrate where the concentration of the first element is highest is less than the depth from the surface of the silicon substrate where the concentration of the second element is highest, and the first element is lighter than the second element.

Alternatively, it may be considered that the depth of a region where the concentration of the first element is highest from the surface of the silicon substrate is less than the depth of the region where the concentration of the second element is $10^{26}$ atoms/m$^3$ or more from the surface of the silicon substrate. Alternatively, it may also be considered that the depth of the region where the concentration of the first element is $10^{26}$ atoms/m$^3$ or more from the surface of the silicon substrate is less than the depth of a region where the concentration of the second element is $10^{26}$ atoms/m$^3$ or more from the surface of the silicon substrate.

(2) Further, in addition to paragraph (1) described above, the depth of the highest concentration portion of the second element from the surface of the semiconductor substrate is 35 nm or less.

(3) Alternatively, in addition to paragraph (1) or (2) described above, both the concentration of the highest concentration portion of the first element and the concentration of the highest concentration of the second element are $10^{26}$ atoms/m$^3$ or more and $10^{27}$ atoms/m$^3$ or less. When a shallow diffusion layer region as in paragraph (2) is formed, it is preferred to increase the concentration of impurities as high as from $10^{26}$ atoms/m$^3$ to $10^{27}$ atoms/m$^3$ in order to lower the electrical resistance.

(4) Alternatively, in addition to at least one of paragraphs (1) to (3) described above, the implantation energy upon ion implantation of phosphor as the first element is decreased to less than 0.45 times the implantation energy upon ion implantation of arsenic as the second element. Further, the implantation energy upon ion implantation of arsenic is $8 \times 10^{-15}$ J or less. In a case where the second element is antimony, the implantation energy upon ion implantation of phosphorus is decreased to less than 0.5 times the implantation energy upon ion implantation of antimony. Further, the implanting energy upon ion implantation of antimony is $7 \times 10^{-15}$ J or less.

(5) Further, in addition to at least one of paragraph (1) to (4) described above, a step of implanting the first element after the implantation of the second element is included.

(6) Further, in addition to at least one of paragraphs (1) to (5) described above, the width of the region having the second element in the direction along the surface of the substrate is larger than the width of the region having the first element in the direction along the surface of the substrate. The region can be defined, for example, substantially by the region having the first element or the second element. As an example, it may be considered to compare the width for the region put between the high concentration region at the first element and the region put between the high concentration region of the second element in a region of a depth shallower than the highest concentration depth of the first element. The depth can be considered for each individual device and, as an example, it may be considered to perform the comparison in the region at a depth of 5 nm from the surface of the substrate.

(7) Alternatively, a semiconductor device includes a semiconductor substrate, a p-well region having impurities of an element belonging to the group III formed on one main surface of the semiconductor substrate, a gate dielectric film formed over the region, a gate electrode formed over the gate dielectric film, and a source or a drain containing impurities of an element belonging to the group V formed corresponding to the gate electrode, in which the source or the drain has a first element belonging to the group V comprising phosphorus and a second element belonging to the group V comprising arsenic or antimony, a first region having the first element belonging to the group V is formed on the cross section traversing the source or the drain, the second region having the second element belonging to the group V is formed on the outside of the first region, and the p-well region is formed on the outside of the second region.

(8) Further, in paragraph (7) described above, the first region has the first element belonging to the group V at a concentration of $10^{26}$ atom/m$^3$ or more and the second region has the second element belonging to the group V at a concentration of $10^{26}$ atoms/m$^3$ or more, and the p-well region is at a concentration of less than $10^{26}$ atoms/m$^3$.

(9) Further, in paragraph (7) described above, a region having the first element belonging to the group V at a concentration of less than $10^{26}$ atoms/m$^3$ is present between the second region and the p-well region.

(10) A method of manufacturing a semiconductor device includes the steps of forming a gate dielectric film in the p-well region, forming a gate electrode, and forming a source or a drain, in which the step of forming the source or the drain includes a second element introduction step of using the first element belonging to the group V comprising phosphorus and the second element belonging to the group V comprising arsenic or antimony, and a first element introduction step of introducing the first element after the second element introduction step to the substrate, and the first element introduction step introduces the element by using the mask used for the introduction of the second element.

(11) Alternatively, a method of manufacturing a semiconductor device includes the steps of forming a gate dielectric film in the p-well region, forming a gate electrode and forming a source or a drain, and has the steps of introducing the first element belonging to the group V comprising phosphorus to the substrate using the gate electrode as a mask, depositing a dielectric film on the sidewall of the gate electrode, a second element introduction step of introducing the second element belonging to the group V comprising arsenic or antimony to the substrate by using the dielectric film of the side wall as a mask and a first element introduction step of introducing the first element after the second element introduction step to the substrate.

(12) A semiconductor device includes a plurality of transistor circuits each including a p-well region, a gate dielectric film, a gate electrode, and a source or a drain. The source or drain has a first element belonging to the group V comprising phosphorus and a second element belonging to the group V comprising arsenic or antimony.

In a first one of the transistor circuits, the gate electrode has a first electrode formed over the gate dielectric film and a second electrode in connection with wiring by way of a dielectric layer over the first electrode. The source or the drain has a first element belonging to the group V comprising phosphorus and a second element belonging to the group V comprising arsenic or antimony. A first region having the first element belonging to the group V is formed on the cross section traversing the source or drain, the second element belonging to the group V is formed on the outside of the first region, and the p-well region is formed on the outside of second region. In addition, in a second one of the second transistor circuits, the gate electrode has a first electrode layer formed over the gate dielectric film and in communication with the wiring, the source or the drain has a first element belonging to the group V comprising phosphorus and a second element belonging to the group V comprising arsenic or antimony. A first region having the first element belonging to the group V is formed on the cross section traversing the source or drain, a second region having the second element belonging to the group V is formed to the outside of the first region, the p-well region is formed to the outside of second region, and a region having the first element belonging to the group V is present between the second region and the p-well region.

BEST MODE FOR CARRYING OUT THE INVENTION

Preferred embodiments of the present invention will be described in detail below.

Figure 1:
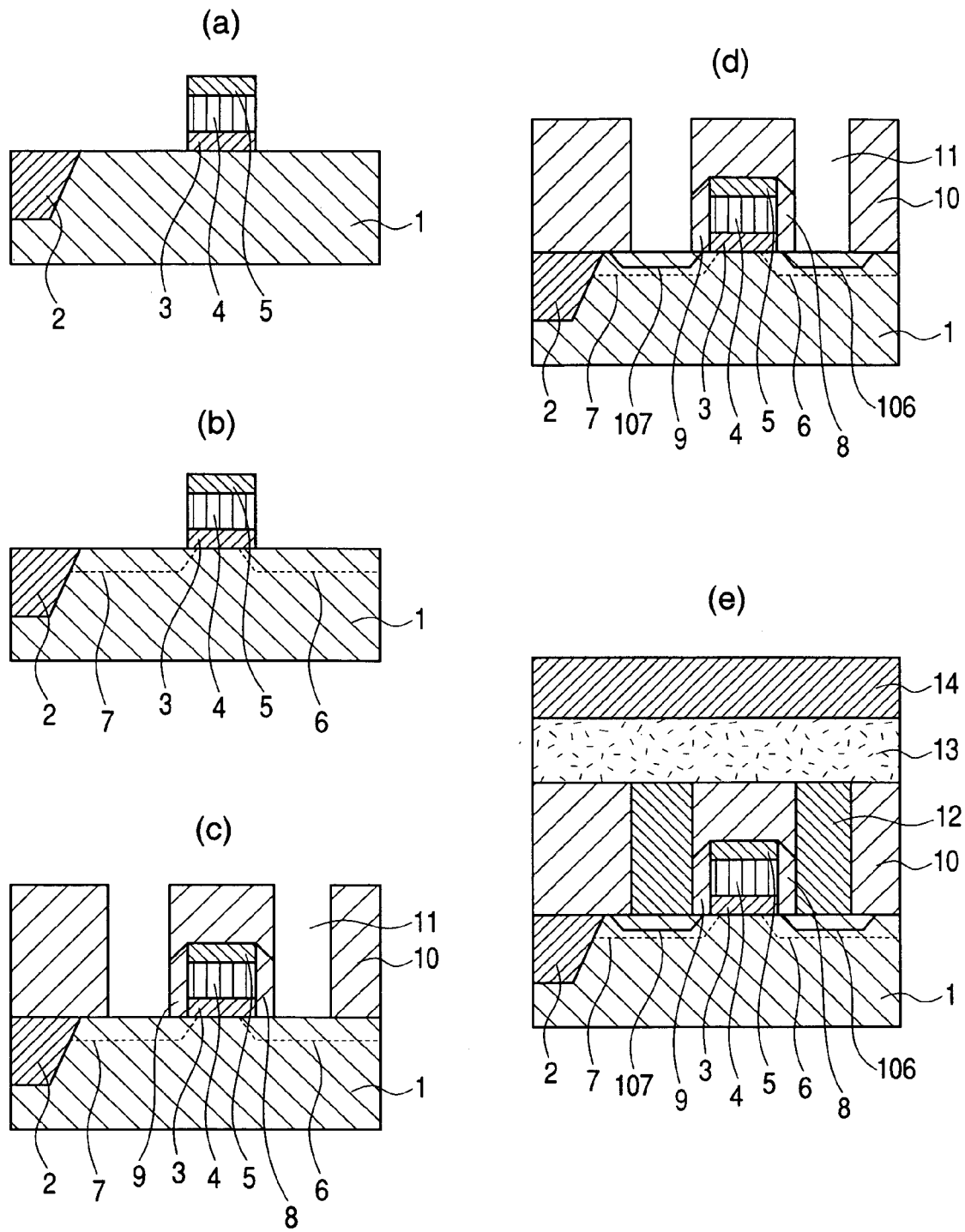
FIGS. 1(a) through 1(e) are cross-sectional views for explaining a semiconductor device and a manufacturing method thereof according to a first embodiment of the present invention.

At first, FIGS. 1(a) to 1(e) show a semiconductor device and a manufacturing method thereof according to a first embodiment of the invention. In this embodiment, as shown in FIG. 1(a), a device isolation film 2, a gate dielectric film 3, a first gate electrode 4 and a second gate electrode 5 are at first formed on a silicon substrate 1. In the drawings, a p-type semiconductor or a p-well portion in which group III impurities of an element belonging to the group III are diffused is shown in an enlarged scale.

Then, as shown in FIG. 1(b), impurities are ion implanted, for example, using the second gate electrode 5 as a mask to form diffusion layers 6 and 7. Broken lines depicted in the portion of the diffusion layers 6 and 7 show the highest concentration portion of the impurities. Further, in this embodiment, the diffusion layer 6 corresponds to a source and a diffusion layer 7 corresponds to a drain. Then, as a next step, a heat treatment, for example, at 800° C. or higher is conducted for making the atom arrangement in the diffusion layers 6 and 7 more orderly. Since a heat treatment is conducted also in the latter step in addition to the heat treatment described above, arsenic and antimony of large mass is used as the impurities of the diffusion layers 6 and 7. Further, with a view of diffusion coefficient, an element of smaller diffusion coefficient is used. In a device having the gate with the lateral length of 130 nm or less, it is preferred that the impurity concentration in the highest concentration portion of the diffusion layers 6 and 7 be from $10^{26}$ atoms/m$^3$ to $10^{27}$ atoms/m$^3$ for keeping the electric resistance low. Further, at a concentration more than $10^{27}$ atoms/m$^3$, since it becomes difficult to easily suppress the occurrence of crystal defects, it is considered that the upper limit is $10^{27}$ atoms/m$^3$.

In the next step, as shown in FIG. 1(c), dielectric film side walls 8 and 9 and a dielectric film 10 are deposited and, further, the dielectric film 10 is etched to form contact holes 11. Then, to lower the electrical resistance further, as shown in FIG. 1(d), impurities are ion implanted to form diffusion layers 106 and 107. Subsequently, as shown in FIG. 1(e), plugs 12 are formed in the contact holes to form an interconnection layer 13 for connection and a dielectric film 14. To lower the contact resistance, a silicide film, for example, may be formed below the plugs 12. Further, although not illustrated, a successive step of forming a multi-layered interconnection for forming dielectric layer, plugs and an interconnection layer thereon may be applied, or a barrier layer or a bonding layer may be formed in contact with the interconnection layer or the plugs.

In FIGS. 1(d), and 1(e), solid lines shown for the portion of the diffusion layers 106 and 107 represent a highest concentration portion of the impurities. Subsequently, a heat treatment, for example, at 800° C. or higher is conducted to make arrangement of atoms in the diffusion layers 106 and 107 more orderly. As described above, since the impurity concentration of from $10^{26}$ atoms/m$^3$ to $10^{27}$ atoms/m$^3$ is necessary for the highest concentration portion of the diffusion layers 6 and 7, crystal defects are liable to occur. Then, to suppress the occurrence of the crystal defects, use of phosphorus as the impurity for the diffusion layers 106 and 107 is effective. This is because the mass is smaller than arsenic or antimony used as the impurities for the diffusion layers 6 and 7, or the diffusion coefficient is larger.

Figure 2:
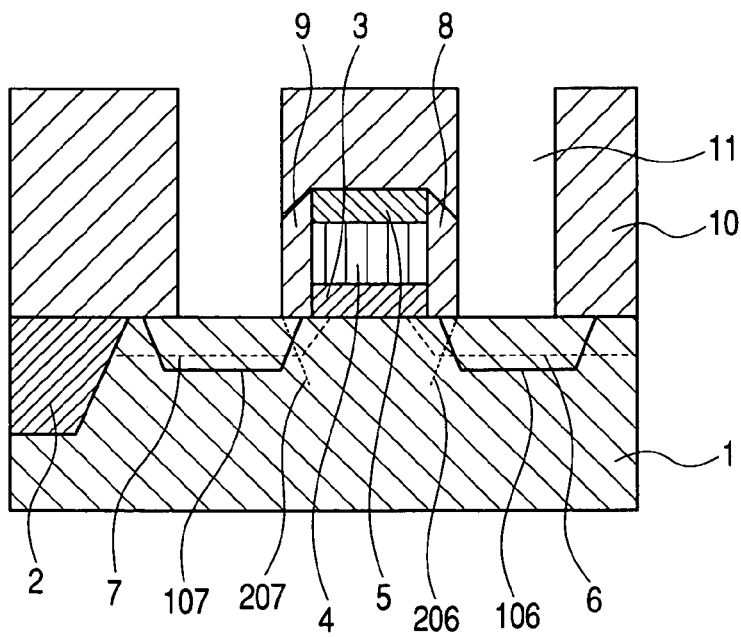
FIG. 2 is a cross-sectional view for explaining a manufacturing method tending to cause crystal defects.

Further, since the atomic radius of arsenic or antimony used as the impurity for the diffusion layers 6 and 7 is greater than that of silicon and compressive stress is generated, phosphorus with the atomic radius smaller than that of silicon is used for the diffusion layers 106 and 107 in order to decrease the compressive stress. To attain the effect of decreasing the stress, it is preferred that the concentration for the highest concentration portion of phosphorus is also at a high concentration of from $10^{26}$ atoms/m$^3$ to $10^{27}$ atoms/m$^3$ like arsenic or antimony. Further, to suppress the occurrence of crystal defects, it is necessary that the depth of the highest concentration portion of phosphorus from the surface of the silicon substrate is less than the depth for the highest concentration portion of arsenic. This is because a large compressive stress is generated in the highest concentration portion of arsenic or antimony and, when phosphorus at high concentration passes through the portion, defects of dislocation that are difficult to be eliminated by the heat treatment occurs by the energy given upon passage (damages). Further, as the order of implantation, it is preferred to conduct a step of implanting phosphorus after implantation of arsenic or antimony. This is shown in FIG. 2. Unlike FIG. 1(d), FIG. 2 shows that the solid line representing the highest concentration portion of phosphorus in the diffusion layers 106 and 107 is located below the broken line representing the highest concentration portion of arsenic or antimony in the diffusion layers 6 and 7 showing that phosphorus at a high concentration passed through the highest concentration portion of arsenic or antimony. FIG. 2 shows crystal defects 206 and 207 referred to as dislocation caused by the energy upon passage of phosphorus. In this case, the region in which phosphorus is mainly diffused can be smaller than the region in which arsenic or antimony is mainly diffused. Further, as the region where the dislocation occurs becomes shallower from the surface of the substrate, since it gives more significant effect on the electric characteristics of a transistor compared with the case where the dislocation occurs in a deep region, it is important to adopt a countermeasure shown in this embodiment.

Figure 3:
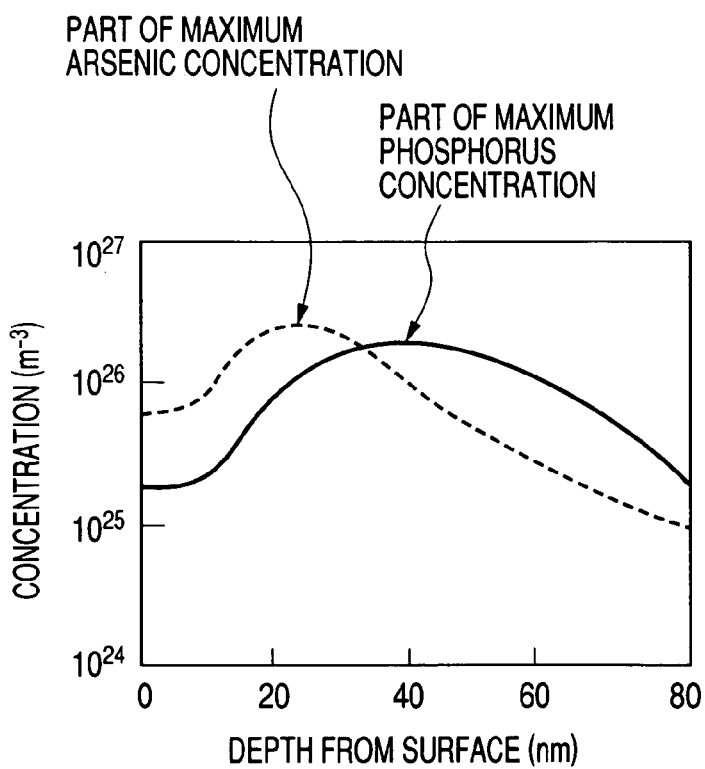
FIG. 3 is a graph explaining the distribution of impurity concentration tending to cause crystal defects.

FIG. 3 shows an example of molecular dynamical analysis for the concentration distribution in a case of causing crystal defects as in the case of FIG. 2. The depth for the highest concentration portion of arsenic and phosphorus shown in FIG. 3 is a value in a case where the implantation energy upon ion implantation of arsenic is at $6.4 \times 10^{-15}$ J and the implantation energy upon ion implantation of phosphorus is at $4.8 \times 10^{15}$ J. In this case, since the depth of the highest concentration portion of phosphorus is deeper than the highest concentration portion of arsenic and phosphorus at a high concentration passes through the highest concentration portion of arsenic to give damages, it is not easy to obtain an effect capable of suppressing crystal defects.

Figure 4:
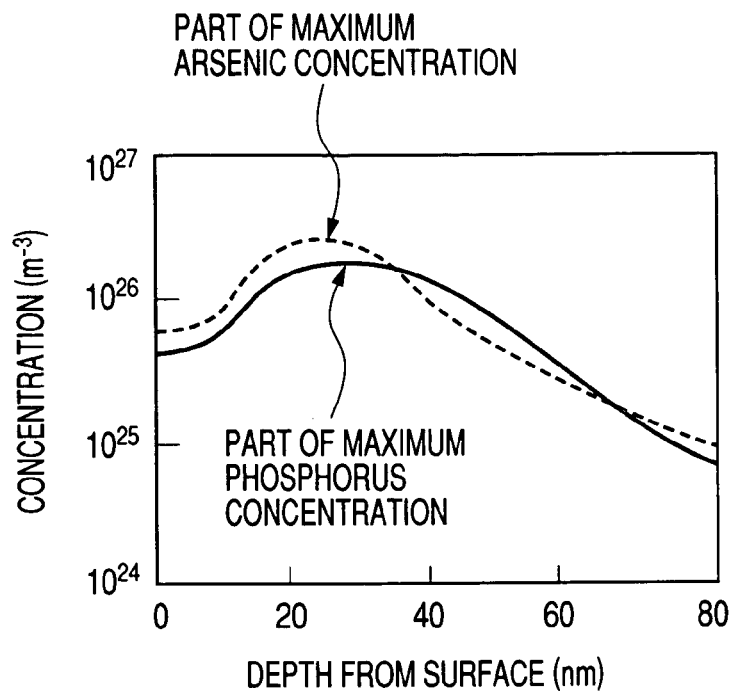
FIG. 4 is a graph for explaining an example of an arsenic concentration distribution and a phosphorus concentration distribution causing less crystal defects in the invention.
Figure 5:
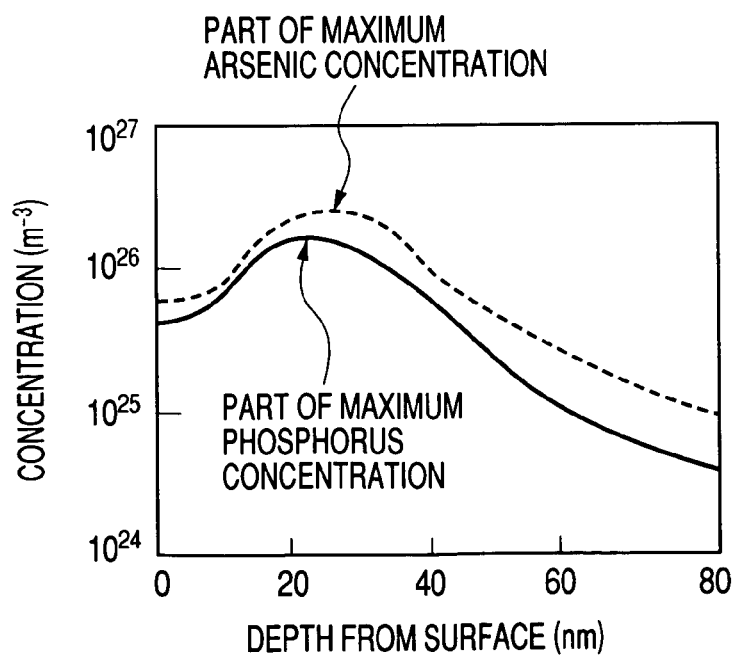
FIG. 5 is a graph for explaining another example of an arsenic concentration distribution and a phosphorus concentration distribution causing less crystal defects in the invention.
Figure 6:
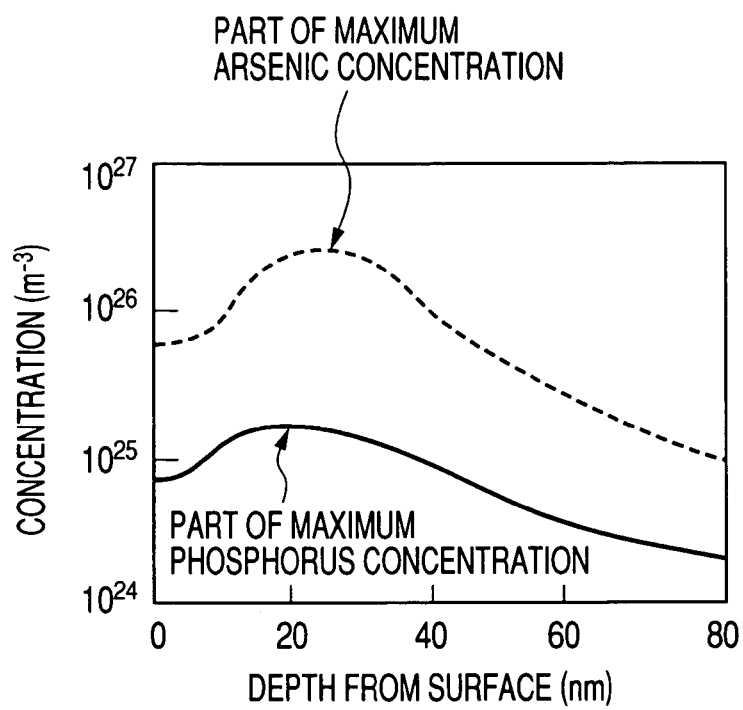
FIG. 6 is a graph for explaining a comparative example of an arsenic concentration distribution and a phosphorus concentration distribution.

On the contrary, when the phosphorus implantation energy is decreased to $2.88 \times 10^{-15}$ J with the arsenic ion implantation energy kept at $6.4 \times 10^{-15}$ J as it is, the depths of the highest concentration portions can be made equal to each other, as shown in FIG. 4. That is, in a case where the phosphorus implantation energy is controlled to 0.45 times the arsenic implantation energy, the depths of the highest concentration portions can be made equal to each other. In this case, it is possible to suppress the phenomenon in which phosphorus at a high concentration passes through the highest concentration portion of arsenic to give energy (damages), thereby making it possible to suppress occurrence of crystal defects. Further, FIG. 5 shows a concentration distribution in a case where the phosphorus implantation energy is decreased to 0.38 times the arsenic implantation energy. In this case, the depth of the highest concentration portion of phosphorus is shallower than the depth of the highest concentration portion of arsenic. Accordingly, since it is possible to prevent phosphorus with a high concentration from passing through the highest concentration portion of arsenic to give damages, occurrence of crystal defects can be suppressed. However, the phosphorus concentrations may be less than $10^{26}$ atoms/m$^3$ even under the same relation of implantation energy as that shown in FIG. 5. In this case, since it is difficult to obtain the effect of decreasing the compressive stress caused by arsenic of larger atomic radius with phosphorus of smaller atomic radius, crystal defects tend to occur when the heat treatment is undergone. FIG. 6 shows an example corresponding to such a case. In a case where the highest concentration of phosphorus is less than $10^{26}$ atoms/m$^3$ as shown in FIG. 6, phosphorus implantation cannot provide the effect of suppressing the crystal defects and cannot provide the effect of lowering the electric resistance sufficiently.

Figure 7:
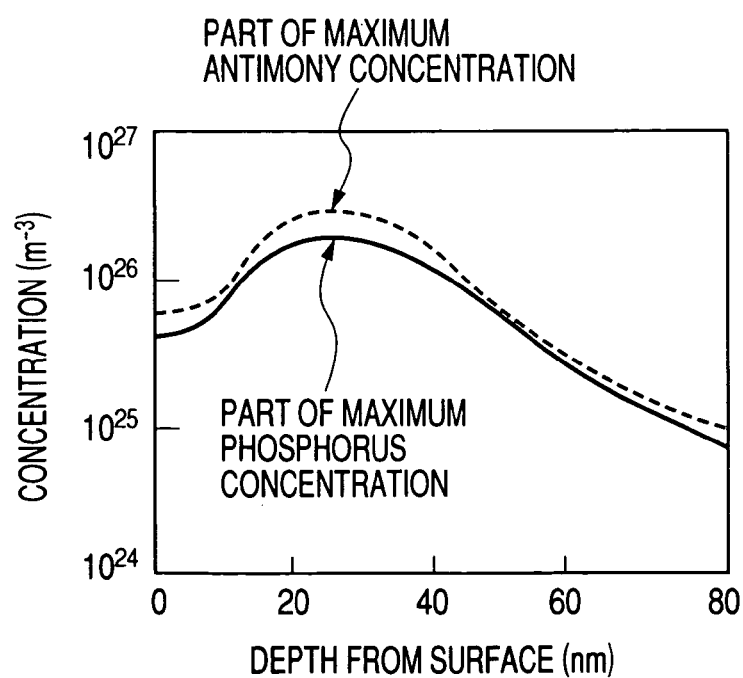
FIG. 7 is a graph for explaining an example of an antimony concentration distribution and a phosphorus concentration distribution causing less crystal defects in the invention.

FIG. 7 shows an example of using antimony instead of arsenic. FIG. 7 shows a concentration distribution where the implantation energy upon ion implantation of antimony is $5.6 \times 10^{-15}$ J and the implantation energy upon phosphorus ion implantation is $2.8 \times 10^{-15}$ J, and the depths of the highest concentration portions are the same between antimony and phosphorus. That is, when the phosphorus implantation energy is decreased to 0.5 times the antimony implantation energy, the depths of the highest concentration portions can be made equal to each other. In this case, it is possible to suppress the phenomenon in which phosphorus passes through the highest concentration portion of antimony to give damages thereto, thereby making it possible to suppress the occurrence of crystal defects.

Figure 8:
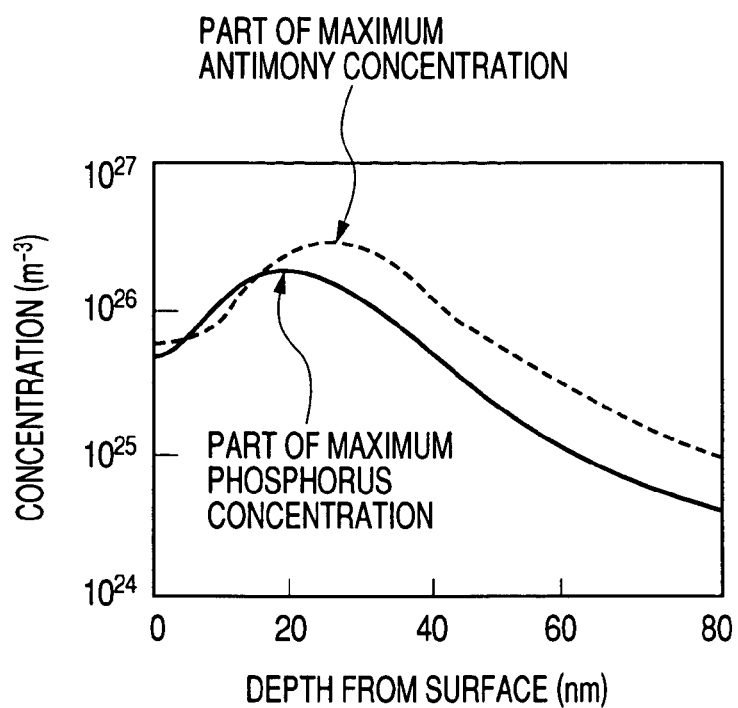
FIG. 8 is a graph for explaining another example of an antimony concentration distribution and a phosphorus concentration distribution causing less crystal defects in the invention.

Further, FIG. 8 shows a concentration distribution in a case of decreasing the phosphorus implantation energy to 0.43 times the antimony implantation energy. In this case, since the depth of the highest concentration portion of phosphorus is shallower than that of antimony, a phenomenon in which phosphorus with a high concentration passes through the highest concentration portion of antimony to give damages thereto neither occurs. Accordingly, occurrence of crystal defects can be suppressed. However, when the phosphorus implantation energy is made more than 0.5 times the antimony implantation energy, since the depth of the highest concentration portion of phosphorus is deeper than that of antimony, phosphorus at a high concentration passed through the highest concentration portion of antimony to give damages thereto, so that it is difficult to suppress the occurrence of the crystal defects.

Further, for the impurities, it is preferred to apply a step of implanting phosphorus after implantation of antimony.

For obtaining of the effect of suppressing the occurrence of the crystal defects, it is preferred to control the depth of the highest concentration portion of arsenic or antimony to 35 nm or less. The compressive stress generated by the intrusion of arsenic or antimony having large atomic radius is larger as the depth of the highest concentration portion increases. When it exceeds 35 nm, crystal defects are caused at the stage before implantation of phosphorus. When the crystal defects are generated in a shallow region, they give a more significant effect on electric characteristics compared with the case where the crystal defects are generated in a deep region. In particular, in a semiconductor device having such a thin diffusion layer that the highest concentration portion of arsenic or antimony as an element to be implanted deeply is 35 nm or less, it is effective in suppressing the deterioration of electric characteristics by suppressing the formation of the crystal defects accompanying impurity introduction in the vicinity of the surface as described above. Further, it can be applied more effectively, for example, to a semiconductor device having such a thin diffusion layer that the depth of the region where the concentration of arsenic or antimony is highest is 25 nm or less.

Figure 9:
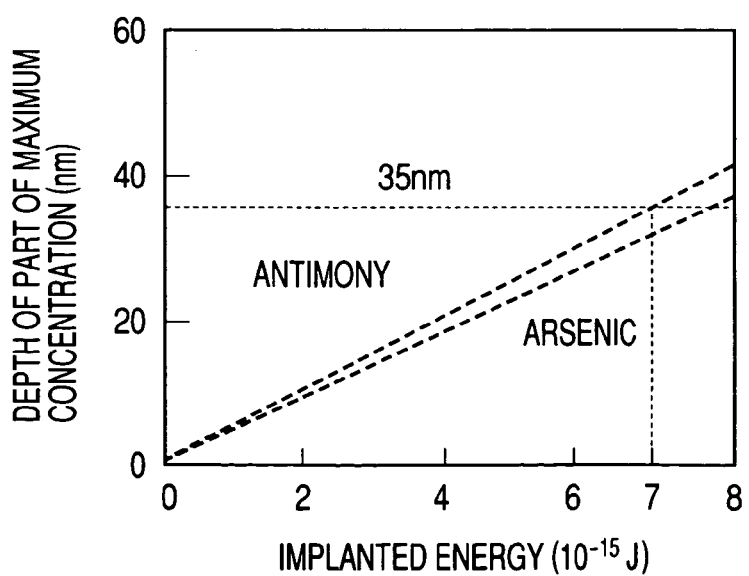
FIG. 9 is a view showing a relationship between an implanting energy and a depth of a highest concentration portion in the present invention.

In view of the relation between the implantation energy and the depth of the highest concentration portion obtained based on the analysis of molecular dynamics (FIG. 9), it is preferred that the arsenic implantation energy is $8 \times 10^{-15}$ J or less and the antimony implantation energy is $7 \times 10^{-15}$ J or less for restricting the depth of the highest concentration portion to 35 nm or less.

Further, a step of implanting boron into a silicon substrate below the gate end may be applied after ion implantation for forming the diffusion layers 6 and 7. Further, in a case where ion implantation at a low concentration (concentration lower than $10^{26}$ atoms/m$^3$) is conducted with an aim of changing the conduction type of the silicon substrate from n-type to p-type or the like, it gives no influence on the desired effect. This is because such implantation gives no significant effect on the profile near the highest concentration portion of the concentration distribution shown in FIGS. 3 to 7.

Figure 10:
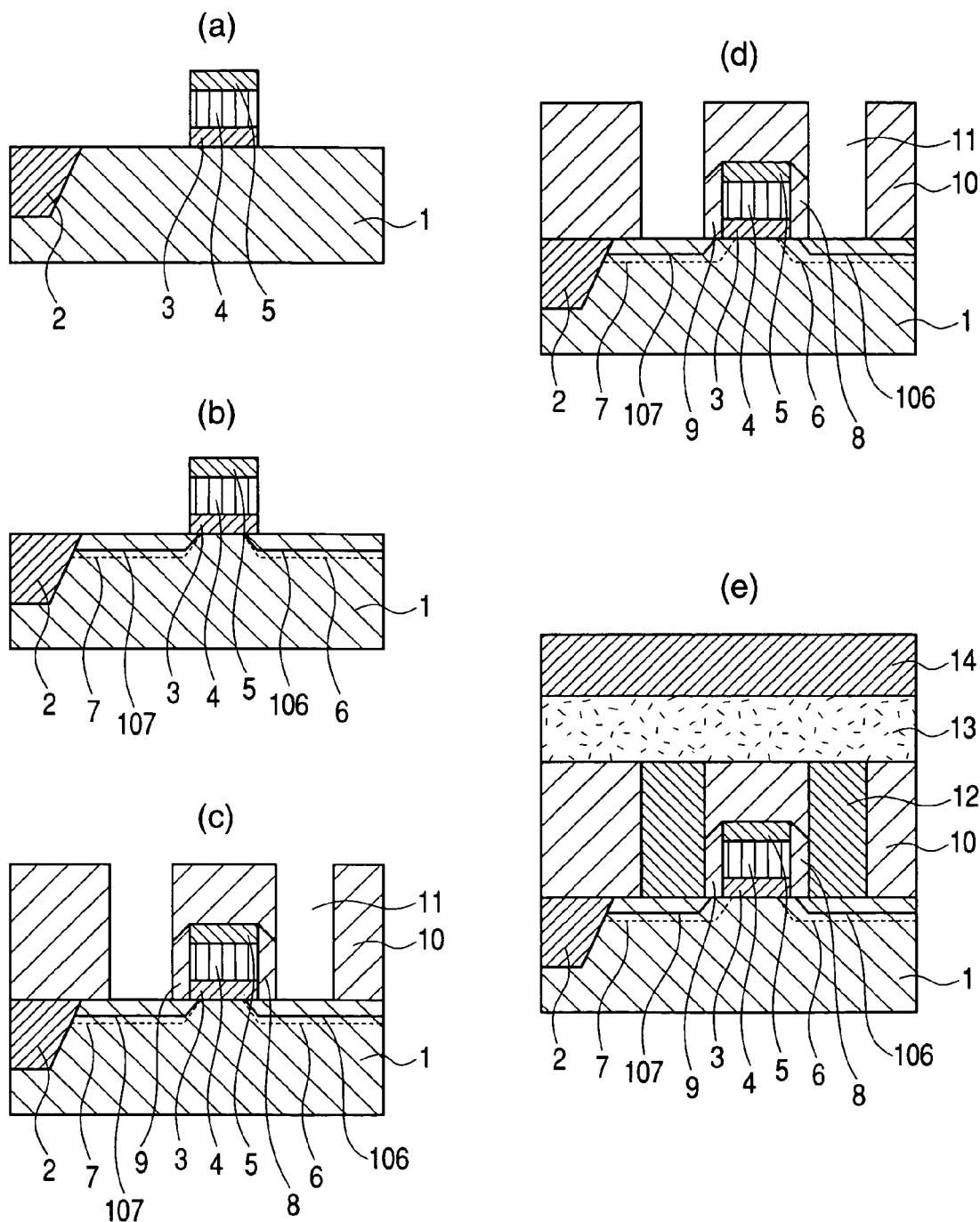
FIGS. 10(a) through 10(e) are a cross sectional views for explaining a semiconductor device and a manufacturing method thereof according to a second embodiment of the present invention.

FIGS. 10(*a*) to 10(*e*) show a semiconductor device and a manufacturing method thereof according to a second embodiment of the present invention. This embodiment is different from the first embodiment mainly in that the step of forming diffusion layers 106 and 107 is applied before formation of dielectric film side walls 8 and 9. In this case, since the steps of forming the diffusion layers 6 and 7 and the diffusion layers 106 and 107 are continuous, the production steps are simple.

Figure 11:
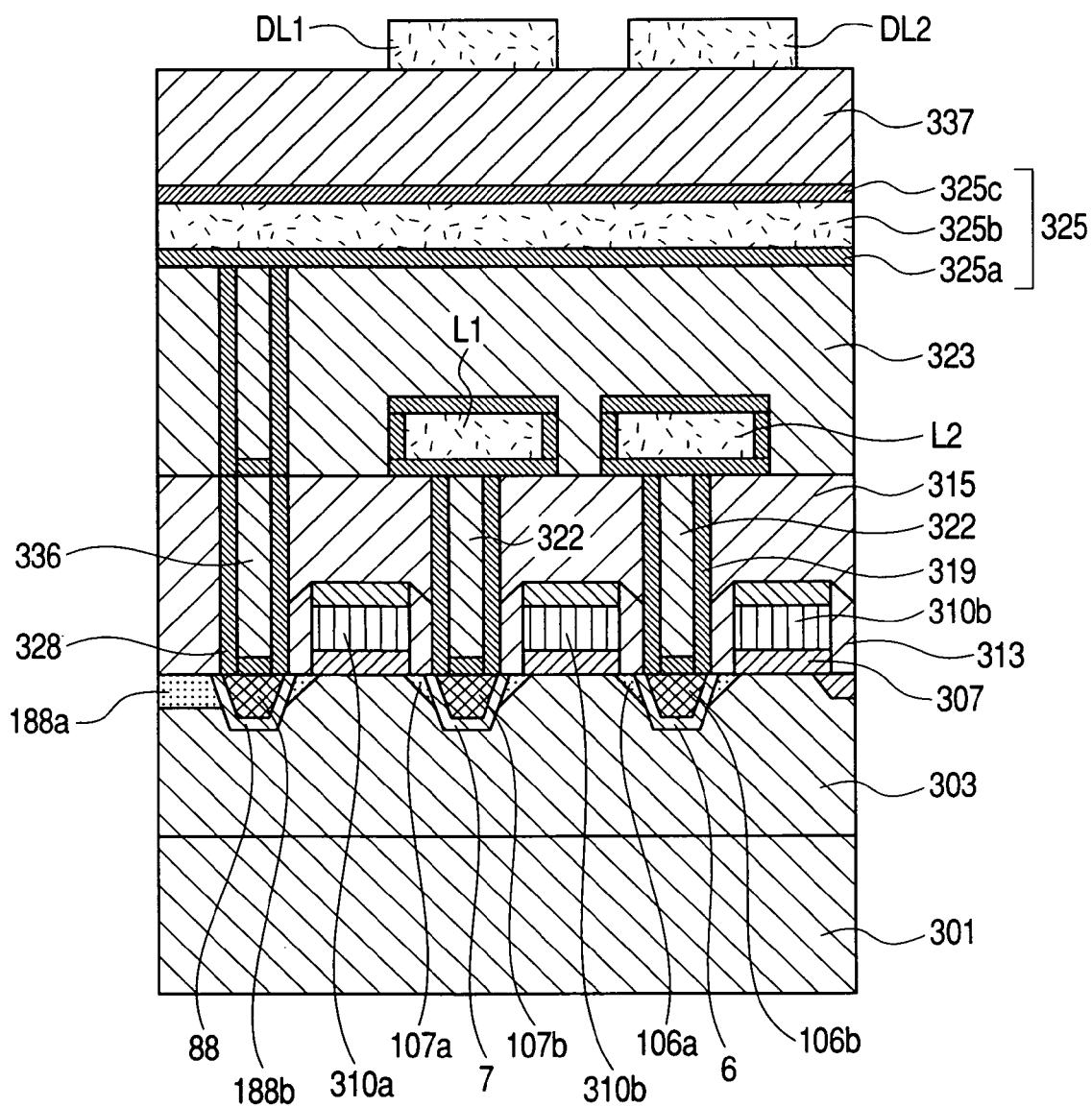
FIG. 11 is a cross sectional view of a main portion of an SRAM as a semiconductor device according to a third embodiment of to the invention.
Figure 12:
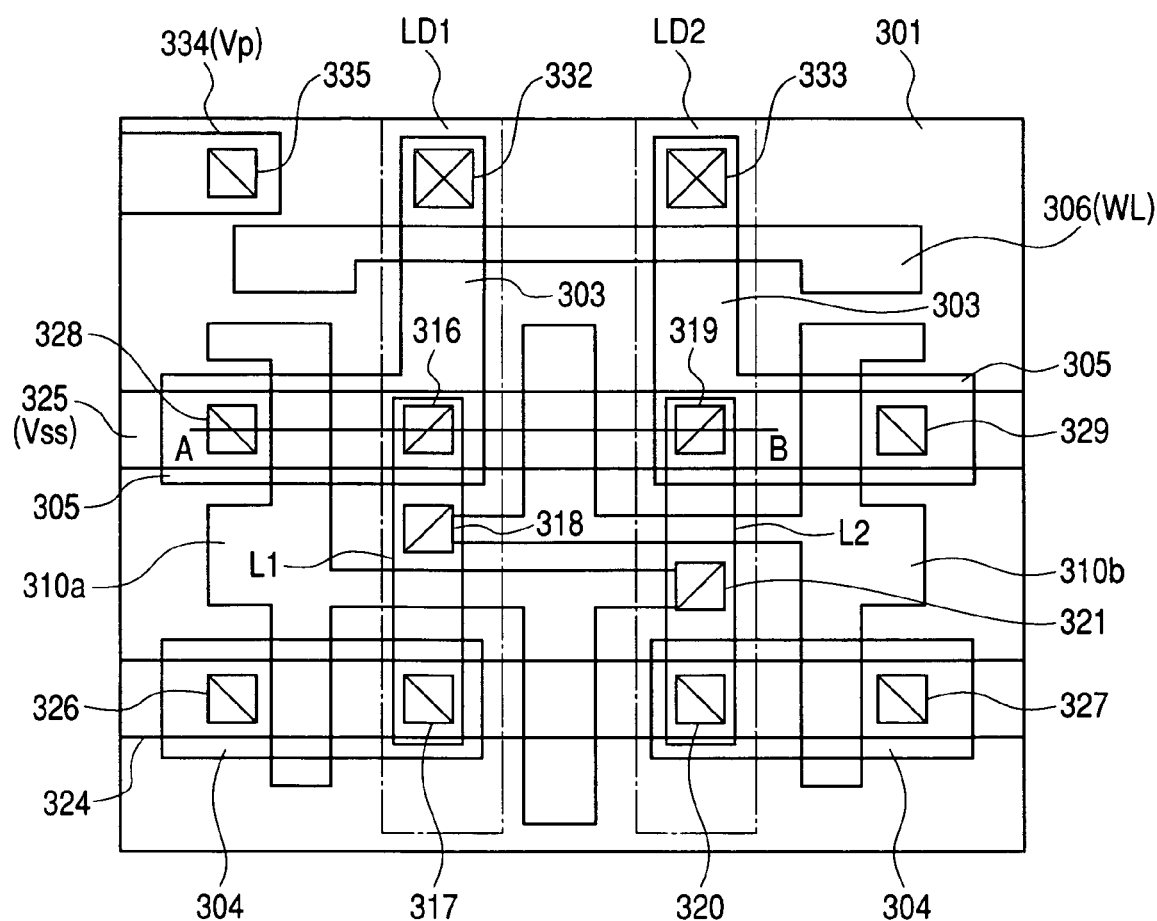
FIG. 12 is a plan view of the main portion of the SRAM as a semiconductor device according to a third embodiment of the invention.

FIG. 11 shows a cross-sectional view of a main portion of an SRAM (Static Random Access Memory) as a semiconductor device according to a third example of the invention. FIG. 11 is a cross sectional view taken along line A–B of FIG. 2, which is a plan view for a main portion of the SRAM. The structure of this example is the same, for example, as that shown in FIG. 2 and FIG. 3 of Japanese Patent Laid-open No. 10-79440, except the diffusion layers. Referring simply to the structure of this embodiment with reference to FIG. 11, a p-type well 303 is formed on a silicon substrate 301 for instance, on which a gate dielectric film 307 is formed. Gate electrodes 310*a*, 310*b* comprising, for example, polycrystal silicon are formed on the gate dielectric film 307 and phosphorus is ion implanted at such a low concentration (concentration lower than $10^{26}$ atoms/m$^3$) as giving no significant effect on the profile in the vicinity of the highest concentration portion using the gate electrodes as the mask, thereby forming diffusion layers 106*a*, 107*a*, and 188*a*. Then, a dielectric film side wall 313 is formed and, subsequently, arsenic is implanted by using, for example, the gate electrodes 310*a*, 310*b* and the dielectric film sidewall 313 as a mask, to form diffusion layers 6, 7, and 88. Then, a heat treatment, for example, at 800° C. is applied and then phosphorus is ion implanted by using quite the same portion as those described above as a mask, that is, the gate electrodes 310*a*, 310*b* and the dielectric film sidewall 313. In this case, the highest concentration and the implantation energy of arsenic and phosphorus forming the diffusion layers 67 and 88 and the diffusion layers 106*a*, 107*a*, 188*a*, 106*b*, 107*b*, and 188*b* are set within the range as described for the first embodiment having the effect of preventing crystal defects. Further, the effect can be obtained even when any or all of the diffusion layers 106*a*, 107*a* and 188*a* is not present. Further, the effect can also be obtained in a case where the heat treatment before formation of the diffusion layers 106b, 107b, and 108b is not applied. Further, as described in the first embodiment, such a structure as using arsenic for the diffusion layers 106a, 107a, and 188a, using phosphorus for the diffusion layers 6, 7 and 8 and not forming the diffusion layers 106b, 107b, and 108 may also be adopted. Also in this case, the highest concentration and the implantation energy of arsenic and phosphorus are determined within a range described for the first embodiment having the effect of preventing crystal defects. After forming of the diffusion layers 106b, 107b, and 188b, a dielectric layers 315 is formed and contact plugs 322 and 337 are formed in contact holes 316 and 319, 328 formed in the layer. A multi-layered interconnection layer including interconnection layers L1, L2, 325, DL1 and DL2, and dielectric layers 323 and 337 are formed over them.

With the constitution described above, since an effective shallow diffusion layer can be formed in addition to the function and the effect explained for the first example, the device can be miniaturized and the operation speed of SRAM can be increased.

Figure 13:
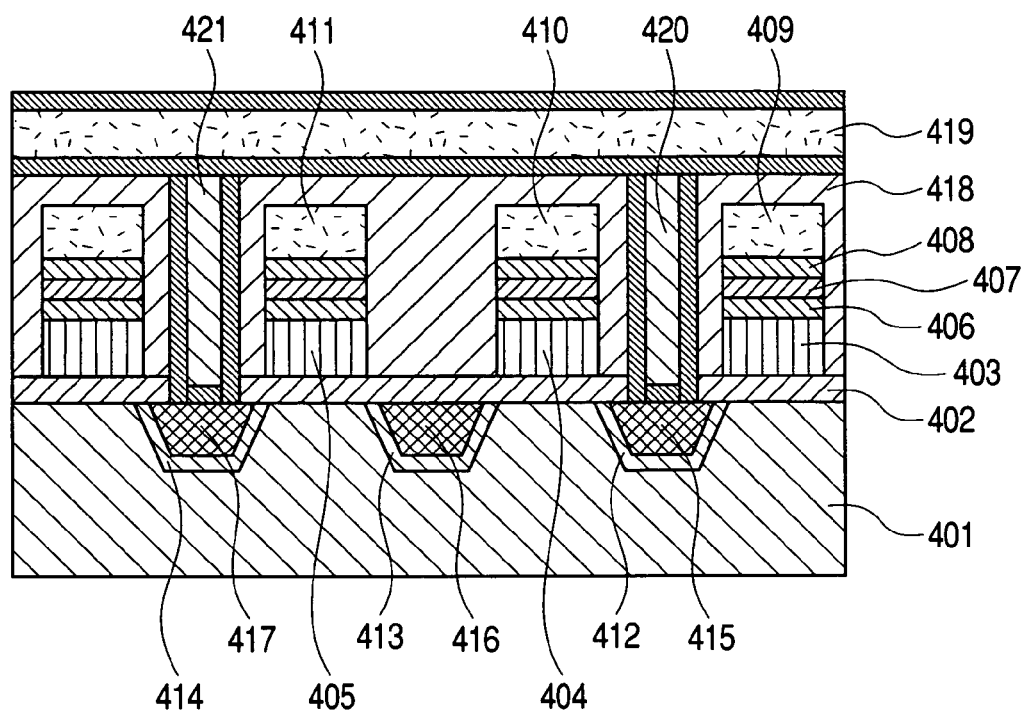
FIG. 13 is a cross sectional view of a main portion of a flash memory as a semiconductor device according to a fourth embodiment of the invention.
Figure 14:
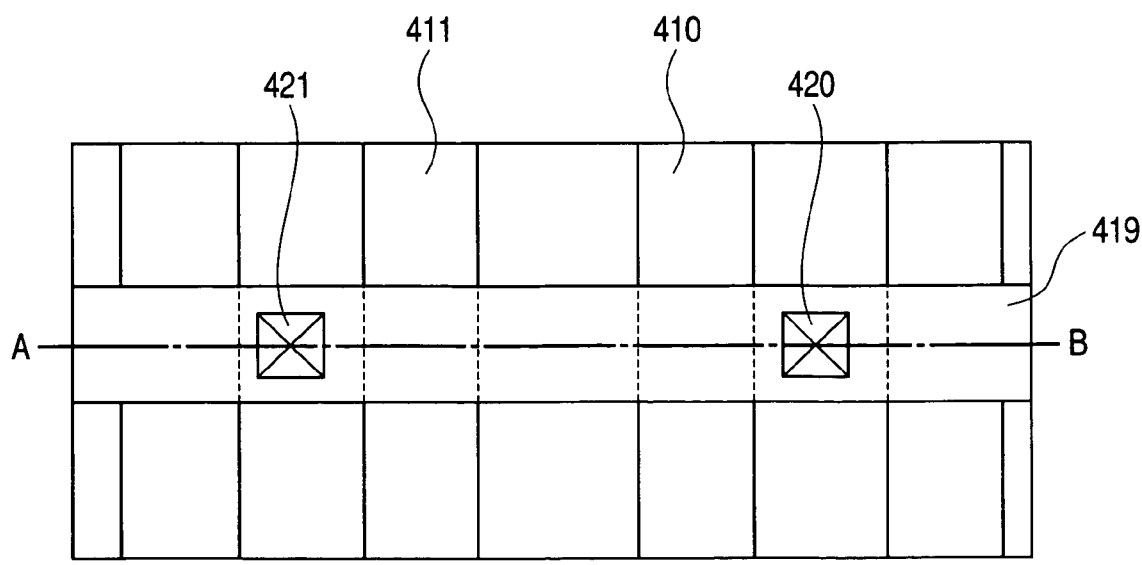
FIG. 14 is a plan view of the main portion of the flash memory as a semiconductor device according to the fourth embodiment of the invention.

FIG. 13 shows a cross sectional view for a main portion of a non-volatile semiconductor memory device as a semiconductor device of a fourth example according to the invention. FIG. 13 is a cross sectional view taken along line A-B in FIG. 14, which is a plan view of a main portion of a flash memory. Referring simply to the structure of this example with reference to FIG. 13, for example, a dielectric film 402 comprising, for example, silicon oxide as a main constituent material is formed on a silicon substrate 401, over which electrodes 403, 404, and 405 comprising, for example, polycrystal silicon as a main constituent material is formed thereover. Then, a dielectric film 402, for example, comprising silicon oxide as a main constituent material, a dielectric film 407, for example, comprising silicon nitride as a main constituent material and a dielectric film 408 comprising, for example, silicon oxide as a main constituent material are formed over them. Further, an electrode 409 and word lines 410 and 411 comprising, for example, polycrystal silicon as a main constituent material are formed over them. Then, arsenic is ion implanted using the electrodes 409 and the work lines 410 and 411 as a mask to form diffusion layers 412, 413, and 414. Subsequently, phosphorus is implanted using quite identical portions as described above as a mask, that is, the electrode 409, and the word lines 410 and 411, to form diffusion layers 415, 416, and 417.

A dielectric film 418 comprising, for example, silicon oxide as a main constituent material is formed over them and, further, a bit line 419 is formed thereon. In this case, the highest concentration and implantation energy of arsenic and phosphorus forming the diffusion layers 412, 413, and 414 and the diffusion layers 415, 416, and 417 are determined within the range described for the first embodiment having the effect of preventing the crystal defects. Further, as described for the first embodiment, the diffusion layers 415, 416, and 417 may be formed after formation of the dielectric film 418 and, in this case, the diffusion layers 415, 416, and 417 are formed by using the electrode 409, the word lines 410 and 411, and the dielectric film 418 as a mask.

In a state where plural electrodes are formed (with a dielectric layer being sandwiched between each of them) over a semiconductor substrate by way of an insulation layer as in a flash memory, it is considered that they are put under a complicate state of stress. However, the reliability of the device can be improved by preventing the occurrence of defects (by forming them) while an element of larger atomic radius and an element of smaller atomic radius than that of silicon of the substrate are used together, thereby suppressing the formation of the highest concentration of the element implanted later passing through the highest concentration region of the element implanted previously.

Further, in a semiconductor device having flash memories and logics such as in a micro computer where flash memories are hybridized, it is preferred to provide ion implantation steps separately in the logic-constituting transistor such as applying a step of ion implanting phosphorus at low concentration (concentration lower than $10^{26}$ atoms/m$^3$) by using the gate electrode as the mask, subsequently implanting arsenic at a high concentration and then implanting phosphorus.

For the aid of understanding the drawings, main reference numerals are to be set forth.

1 . . . silicon substrate, 2 . . . device isolation film, 3 . . . gate dielectric film, 4 . . . first gate electrode, 5 . . . second gate electrode, 6, 7 . . . diffusion layer, 7a, 7b . . . gate dielectric film, 8, 9 . . . dielectric film side wall, 10 . . . dielectric film, 11 . . . contact hole, 12 . . . plug 13 . . . interconnection layer, 14 . . . dielectric layer, 106, 107 . . . diffusion layer, 206, 207 . . . dislocation, 88, 188a, 188b, 106a, 106b, 107a, 107b . . . diffusion layer, 301 . . . substrate, 303 . . . p-type well, 304 . . . n-type well, 305 . . . diffusion layer region, 306, 310a, 310b . . . gate electrode, 313 . . . dielectric film side wall, 315 . . . dielectric layer, 316, 319, 328 . . . contact hole, 322, 336 . . . contact plug, L1, L2, 325, DL1, DL2 . . . interconnection layer, DL1, 323, 337 . . . dielectric layer, 401 . . . substrate, 402 . . . dielectric film, 403, 403, 405 . . . electrode, 406, 407, 408 . . . dielectric film, 409 . . . electrode, 410, 411 . . . word line, 412, 413, 414, 415, 416, 417 . . . diffusion layer, 418 . . . dielectric film, 419 . . . bit line.

INDUSTRIAL APPLICABILITY

According to the present invention, a semiconductor device having a high degree of reliability and a manufacturing method of the semiconductor device can be provided.

The invention claimed is:

1. A semiconductor device comprising:
a silicon substrate;
a region having impurities of an element belonging to the group III formed on one main surface of the semiconductor substrate;
a gate dielectric film formed in the region;
a gate electrode formed by being stacked on the gate dielectric film; and
a source or a drain containing impurities of an element belonging to the group V element corresponding to the gate electrode;
wherein:
the source or the drain has a first element comprising phosphorus and a second element comprising arsenic or antimony;
a depth from the surface of the silicon substrate where a concentration of the first element is highest is less than a depth from the surface of the silicon substrate where a concentration of the second element is highest; and
a concentration of the element in the region where the concentrations of the first element and the second element are highest is from $10^{26}$ atoms/m$^3$ or more and $10^{27}$ atoms/m$^3$ or less.

2. A semiconductor device comprising:
a silicon substrate;

a P-well having impurities of an element belonging to the group III formed on one main surface of the silicon substrate;

a gate dielectric film formed to the region;

a gate electrode formed by being stacked on the gate dielectric film; and a source or a drain containing impurities of an element belonging to the group V element corresponding to the gate electrode;

wherein:

at least the source or the drain is formed with a diffusion layer containing a first element comprising phosphorus and a second element comprising at least arsenic or antimony;

a depth from the surface of the silicon substrate where a concentration of the first element is highest is less than a depth from the surface of the silicon substrate where a concentration of the second element is highest;

the depth of the region, where the concentration of the second element is highest, from the silicon substrate is 35 nm or less; and the concentration of the element in the region where the concentrations of the first element and the second element are highest is from $10^{26}$ atoms/m$^3$ or more and $10^{27}$ atoms/m$^3$ or less.

* * * * *